(12) United States Patent
Blodgett et al.

(10) Patent No.: US 11,935,183 B2
(45) Date of Patent: Mar. 19, 2024

(54) OCCLUSION SOLUTION WITHIN A MIXED REALITY DESIGN SOFTWARE APPLICATION

(71) Applicant: DIRTT ENVIRONMENTAL SOLUTIONS LTD., Alberta (CA)

(72) Inventors: Robert William Blodgett, Salt Lake City, UT (US); Joseph S. Howell, Uintah, UT (US)

(73) Assignees: DIRTT ENVIRONMENTAL SOLUTIONS LTD., Calgary (CA); ARMSTRONG WORLD INDUSTRIES, INC., Lancaster, PA (US)

( * ) Notice: Subject to any disclaimer, the term of this patent is extended or adjusted under 35 U.S.C. 154(b) by 0 days.

(21) Appl. No.: 17/757,354

(22) PCT Filed: Jan. 5, 2021

(86) PCT No.: PCT/IB2021/050050
§ 371 (c)(1),
(2) Date: Jun. 14, 2022

(87) PCT Pub. No.: WO2021/140439
PCT Pub. Date: Jul. 15, 2021

(65) Prior Publication Data
US 2023/0021117 A1 Jan. 19, 2023

Related U.S. Application Data

(60) Provisional application No. 62/959,321, filed on Jan. 10, 2020.

(51) Int. Cl.
*G06T 15/00* (2011.01)
*G06F 30/13* (2020.01)
(Continued)

(52) U.S. Cl.
CPC .............. *G06T 15/40* (2013.01); *G06F 30/13* (2020.01); *G06T 7/80* (2017.01); *G06T 19/006* (2013.01);
(Continued)

(58) Field of Classification Search
None
See application file for complete search history.

(56) References Cited

U.S. PATENT DOCUMENTS

| | | |
|---|---|---|
| 2004/0032409 A1 | 2/2004 | Girard |
| 2012/0188342 A1* | 7/2012 | Gervautz .................. G06T 7/73 348/46 |

(Continued)

FOREIGN PATENT DOCUMENTS

WO 2019/126002 A1 6/2019

OTHER PUBLICATIONS

International Preliminary Report on Patentability received for PCT Patent Application No. PCT/IB2021/050050, dated Jul. 21, 2022, 6 pages.

(Continued)

*Primary Examiner* — Martin Mushambo
(74) *Attorney, Agent, or Firm* — Workman Nydegger

(57) ABSTRACT

A method for incorporating a real object at varying depths within a rendered three-dimensional architectural design space can include capturing data from a real environment, wherein the real environment comprises at least one real object within a physical architectural space. The method can also comprise extracting the at least one real object from the captured data from the real environment. Further, the method can include providing a rendered three-dimensional architectural design space comprising at least one virtual architectural component. The method can also include projecting the captured data from the real environment on a first (Continued)

plane within the rendered three-dimensional architectural design space and projecting the extracted at least one real object on a at least one additional plane within the rendered three-dimensional architectural design space, such that the rendered at least one real object is properly occluded within the rendered three-dimensional architectural design space.

20 Claims, 10 Drawing Sheets

(51) Int. Cl.
    *G06T 7/80*     (2017.01)
    *G06T 15/40*     (2011.01)
    *G06T 19/00*     (2011.01)
    *G06V 10/26*     (2022.01)
    *G06V 20/20*     (2022.01)
    *G06V 20/64*     (2022.01)

(52) U.S. Cl.
    CPC .............. *G06V 10/26* (2022.01); *G06V 20/20* (2022.01); *G06V 20/64* (2022.01); *G06T 2210/04* (2013.01)

(56) References Cited

U.S. PATENT DOCUMENTS

| | | | |
|---|---|---|---|
| 2012/0206452 | A1 | 8/2012 | Geisner et al. |
| 2017/0060384 | A1* | 3/2017 | Baardse .............. G06F 3/04845 |
| 2018/0114264 | A1 | 4/2018 | Rafii et al. |
| 2018/0197340 | A1 | 7/2018 | Loberg et al. |
| 2019/0261000 | A1 | 8/2019 | Oh et al. |
| 2020/0193628 | A1* | 6/2020 | Chakraborty ......... G06F 18/217 |

OTHER PUBLICATIONS

International Search Report & Written Opinion for application No. PCT/IB2021/050050 dated Apr. 13, 2021.
European Search Report received for EP Patent Application No. 21738000.5, dated Jan. 19, 2024, 12 pages.
Feng et al., "Realization of Multilayer Occlusion between Real and Virtual Scenes in Augmented Reality", 2006 10th International Conference on Computer Supported Cooperative Work in Design, May 2006, pp. 1-5.

* cited by examiner

900

905 Receive Captured Data From A Real Environment Comprising At Least One Real Object Within A Physical Architectural Space

910 Extract The At Least One Real Object From The Captured Data From The Real Environment

915 Provide A Rendered Three-Dimensional Architectural Design Space Comprising One Or More Virtual Architectural Components, Wherein Each Virtual Architectural Component Is Designed To Coordinate With The Physical Architectural Space

920 Project The Captured Data From The Real Environment On A First Plane Within The Rendered Three-Dimensional Architectural Design Space

925 Project The Extracted At Least One Real Object On At Least One Additional Plane Within The Rendered Three-Dimensional Architectural Design Space, Such That A Position Of The At Least One Additional Plane Causes The At Least One Real Object To Either Occlude Or Be Occluded By At Least One Of The One Or More Virtual Architectural Components

Capturing, With One Or More Sensors, Data From A Real Environment Comprising At Least One Real Object Within A Physical Architectural Space

1010

Extracting The At Least One Real Object From The Captured Data From The Real Environment By Separating Data Related To The At Least One Real Object From Data Related To The Physical Architectural Space

1015

Providing A Rendered Three-Dimensional Architectural Design Space Comprising One Or More Virtual Architectural Components, Wherein Each Virtual Architectural Component Is Designed To Coordinate With The Physical Architectural Space

1020

Projecting The Captured Data From The Real Environment On A First Plane Within The Rendered Three-Dimensional Architectural Design Space

1025

Projecting The Extracted At Least One Real Object On At Least One Additional Plane Within The Rendered Three-Dimensional Architectural Design Space, Such That A Position Of The At Least One Additional Plane Causes The At Least One Real Object To Either Occlude Or Be Occluded By At Least One Of The One Or More Virtual Architectural Components

FIG. 10

OCCLUSION SOLUTION WITHIN A MIXED REALITY DESIGN SOFTWARE APPLICATION

CROSS-REFERENCE TO RELATED APPLICATIONS

The present invention is a 35 U.S.C. § 371 U.S. National Stage of PCT Application No. PCT/IB2021/050050, filed on Jan. 5, 2021, which claims priority to and the benefit of U.S. Application No. 62/959,321, filed Jan. 10, 2020, and entitled OCCLUSION SOLUTION WITHIN A MIXED REALITY DESIGN SOFTWARE APPLICATION, the entire content of which is incorporated herein by reference.

BACKGROUND

Technical Field

The present disclosure generally relates to computer-aided design or drafting software. More specifically, the present disclosure relates to systems, methods, and apparatus for providing an occlusion solution within a mixed reality architectural design software application.

Related Technology

As computerized systems have increased in popularity, so have the range of applications that incorporate computational technology. Computational technology now extends across a broad range of applications, including a wide range of productivity and entertainment software. Indeed, computational technology and related software can now be found in a wide range of generic applications that are suited for many environments, as well as fairly industry-specific software.

One such industry that has employed specific types of software and other computational technology increasingly over the past few years is that related to building and/or architectural design. In particular, architects and interior designers ("or designers") use a wide range of computer-aided design (CAD) software or building information (BIM) software (i.e., "architectural design software applications") for designing the aesthetic as well as functional aspects of a given residential or commercial space. For example, a designer might use a CAD or BIM program to design a building or part of a building, and then utilize drawings or other information from that program to order or manufacture building components.

One particular benefit that is offered by modern CAD and BIM software is the ability to see a three-dimensional rendering of an architectural design. This can provide tremendous value to designers and/or clients who wish to visualize a design before starting the actual building process. In even more recent embodiments of CAD and BIM software, a user may be able to view a completely rendered office building within a virtual-reality environment or mixed-reality environment. The user may be able to navigate within the three-dimensional renderings such that the user can view different perspectives and locations throughout the design.

While three-dimensional renderings can provide a user with a general idea regarding a final product, conventional three-dimensional renderings suffer from several shortcomings. For example, the difficulty of occluding virtual objects behind real objects within a rendered architectural environment. Conventional three-dimensional rendering software does not successfully occlude objects in a mixed reality design space.

Accordingly, there are a number of problems in the art that can be addressed.

BRIEF SUMMARY OF THE INVENTION

At least one implementation of the present invention comprises a method for incorporating a real object at varying depths within a rendered three-dimensional architectural design space. The method can include capturing data from a real environment, wherein the real environment comprises at least one real object within a physical architectural space. The method can also comprise extracting the at least one real object from the captured data from the real environment. Further, the method can include providing a rendered three-dimensional architectural design space comprising one or more virtual architectural components. Finally, the method can include projecting the captured data from the real environment on a first plane within the rendered three-dimensional architectural design space and projecting the extracted at least one real object on at least one additional plane within the rendered three-dimensional architectural design space, the at least one additional plane being positioned such that the projected at least one real object is properly occluded within the rendered three-dimensional architectural design space.

Additional features and advantages of exemplary implementations of the invention will be set forth in the description which follows, and in part will be obvious from the description, or may be learned by the practice of such exemplary implementations. The features and advantages of such implementations may be realized and obtained by means of the instruments and combinations particularly pointed out in the appended claims. These and other features will become more fully apparent from the following description and appended claims or may be learned by the practice of such exemplary implementations as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 9 depicts a flowchart of a sequence of acts in a method for incorporating a real object at varying depths within a rendered three-dimensional architectural design space according to at least one implementation of the present invention; and FIG. 10 depicts a flowchart of a sequence of acts in an alternative method for incorporating a real object at varying depths within a rendered three-dimensional architectural design space according to at least one implementation of the present invention.

DETAILED DESCRIPTION OF THE PREFERRED EMBODIMENTS

Implementations of the present invention solve one or more problems in the art with systems, methods, and apparatus configured to incorporate a real object at varying depths within a rendered three-dimensional architectural design space. More specifically, at least one implementation of the present invention comprises a method for incorporating a real object at varying depths within a rendered three-dimensional architectural design space. The method can include capturing data from a real environment, wherein the real environment comprises at least one real object within a physical architectural space. The method can also comprise extracting at least one real object from the captured data from the real environment. Further, the method can include providing a rendered three-dimensional architectural design space comprising at least one virtual architectural component.

Further, the method can include projecting the captured data from the real environment on a first plane within the rendered three-dimensional architectural design space and projecting the extracted at least one real object on at least one additional plane within the rendered three-dimensional architectural design space. By projecting the captured data from the real environment on multiple planes within the rendered three-dimensional architectural design space, the at least one virtual architectural component may be properly occluded when the at least one real object is closer to a camera than the at least one virtual architectural component. Additionally or alternatively, the at least one virtual architectural component may not be occluded when the at least one real object is further away from the camera than the at least one virtual architectural component.

As used herein, the term "properly occluded" means that a real object projected within a rendered three-dimensional architectural design space either occludes or is occluded by any virtual architectural components therein as the real object would occlude or be occluded in a corresponding real environment having corresponding real architectural components. In other words, a rendered real object is "properly occluded" when (i) the rendered real object is occluded by any virtual architectural components positioned between the real object and the virtual camera, and (ii) the rendered real object occludes any virtual architectural components that are positioned behind the real object relative to the virtual camera. Furthermore, occluded objects or components can comprise objects or components that are either partially or completely hidden from view by the occluding object or component.

Figure 1:
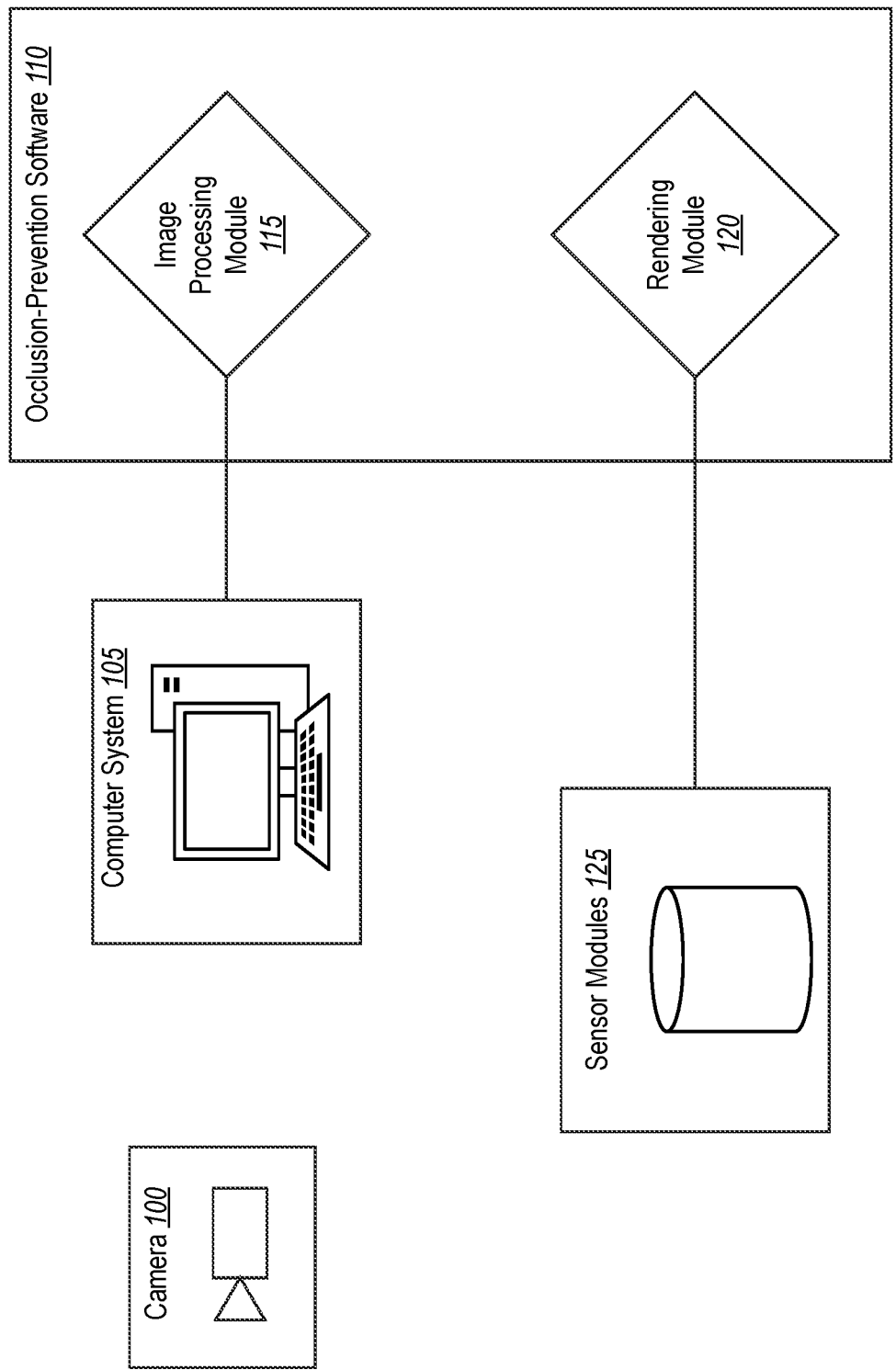
FIG. 1 illustrates a schematic view of a system for incorporating a real object at varying depths within a rendered three-dimensional architectural design space in accordance with an implementation of the present invention.

FIG. 1 illustrates a schematic of a computerized system for incorporating a real object at varying depths within a rendered three-dimensional architectural design space in accordance with the present invention. As shown, a camera 100 is in communication with a computer system 105. In at least one implementation, camera 100 and computer system 105 communicate via a network connection.

One skilled in the art will appreciate that the depicted schematic is merely exemplary, and although computer system 105 is depicted in FIG. 1 as a desktop computer, computer system 105 can take a variety of forms. Computer system 105 may be a mobile phone, laptop computer, a tablet computer, a wearable device, a mainframe, etc. As used herein, the term "computer system" includes any device, system, or combination thereof that includes one or more processors, and a physical and tangible computer-readable memory capable of having thereon computer-executable instructions that are executable by the one or more processors.

As shown in FIG. 1, computer system 105 is also in communication with occlusion-prevention software 110. In at least one implementation, computer system 105 and occlusion-prevention software 110 also communicate via a network connection. Computer system 105 can comprise one or more computer-readable storage media having stored thereon executable instructions that when executed by the one or more processors configure computer system 105 to execute occlusion-prevention software 110. Occlusion-prevention software 110 may comprise various modules, such as an image processing module 115 and a rendering module 120. As used herein, a module may comprise a software component, including a software object, a hardware component, such as a discrete circuit, a field-programmable gate array (FPGA), a computer processor, or some combination of hardware and software.

One will understand, however, that separating modules into discrete units is at least somewhat arbitrary and that modules can be combined, associated, or separated in ways other than shown in FIG. 1 and still accomplish the purposes of this invention. Accordingly, modules 115 and 120 of FIG. 1 are only shown for illustrative and exemplary purposes.

Figure 2:
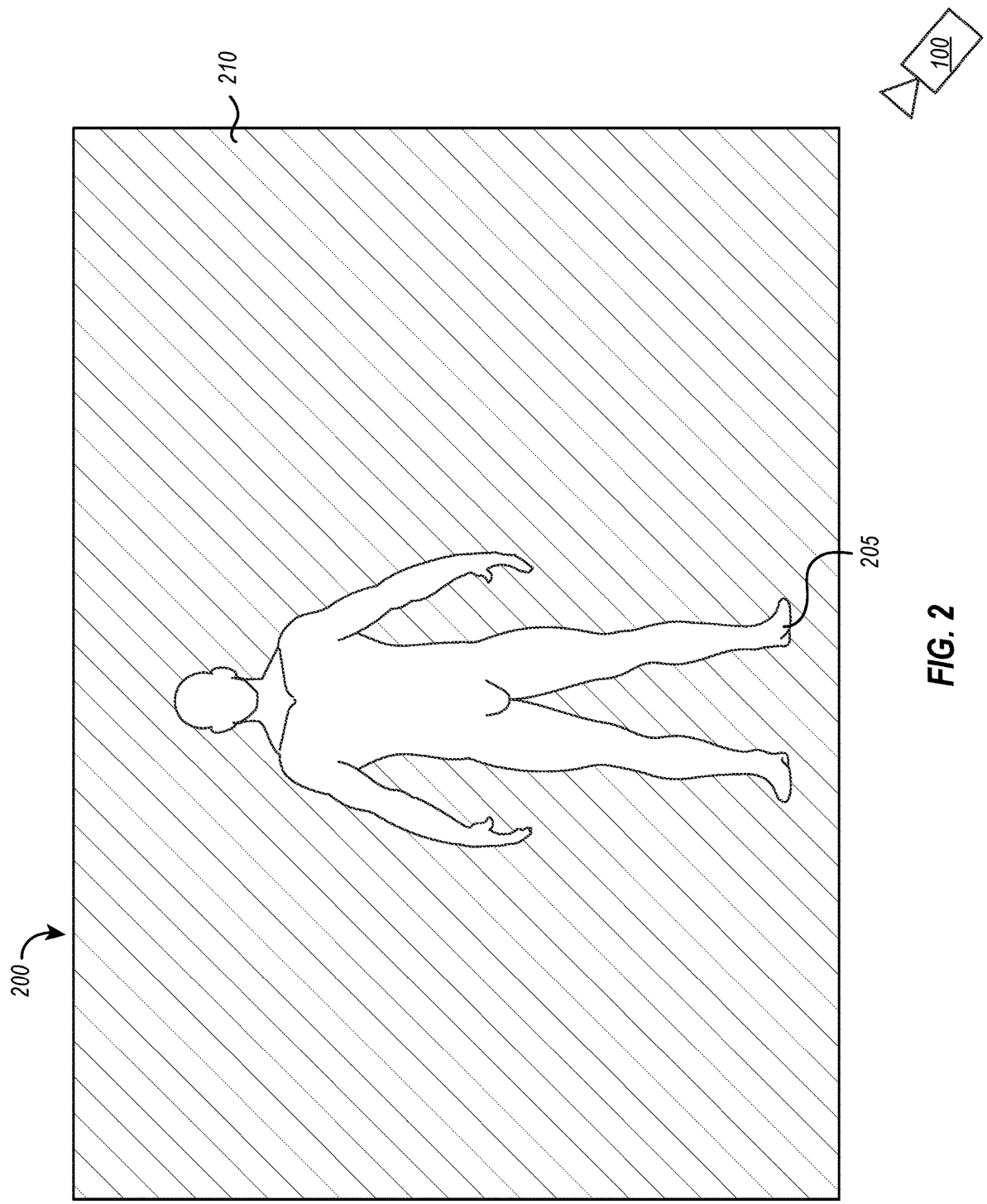
FIG. 2 illustrates an image from a real environment that includes a real object.

The image processing module 115 may be configured to receive a captured image from a real environment 200. As shown in FIG. 2, the captured image from the real environment 200 can include a real object 205—in this case a person—and a background 210. Background 210 may include data and imagery of a physical architectural space, such as an enclosed room or a delimited area in which an architectural design is under consideration. Alternatively, background 210 can comprise one or more virtual objects, structures, or components intended to further define a design space within real environment 200. For example, while real environment 200 may comprise a large empty space designated as a design area, one or more virtual walls may be introduced to captured background 210 in order to represent a separated space intended for architectural design.

As discussed herein, architectural designs may include permanent, temporary, or interchangeable structural components, furniture pieces, components, and/or any items that are intended to be places or installed within a specified area, whether such area is enclosed to form a room or otherwise demarcated for the purposes of architectural design efforts.

Camera 100 is also shown in FIG. 2, indicating at what angle the captured image from real environment 200 is taken in this particular example. In at least one implementation, the captured image from real environment 200 is captured by one or more infrared cameras. The captured image from real environment 200 may also be captured by a depth camera. At least one implementation includes generating a voxel-based representation of real object 205 (i.e., the person) based on image data captured by cameras in a tracked, real, three-dimensional environment.

Figure 3:
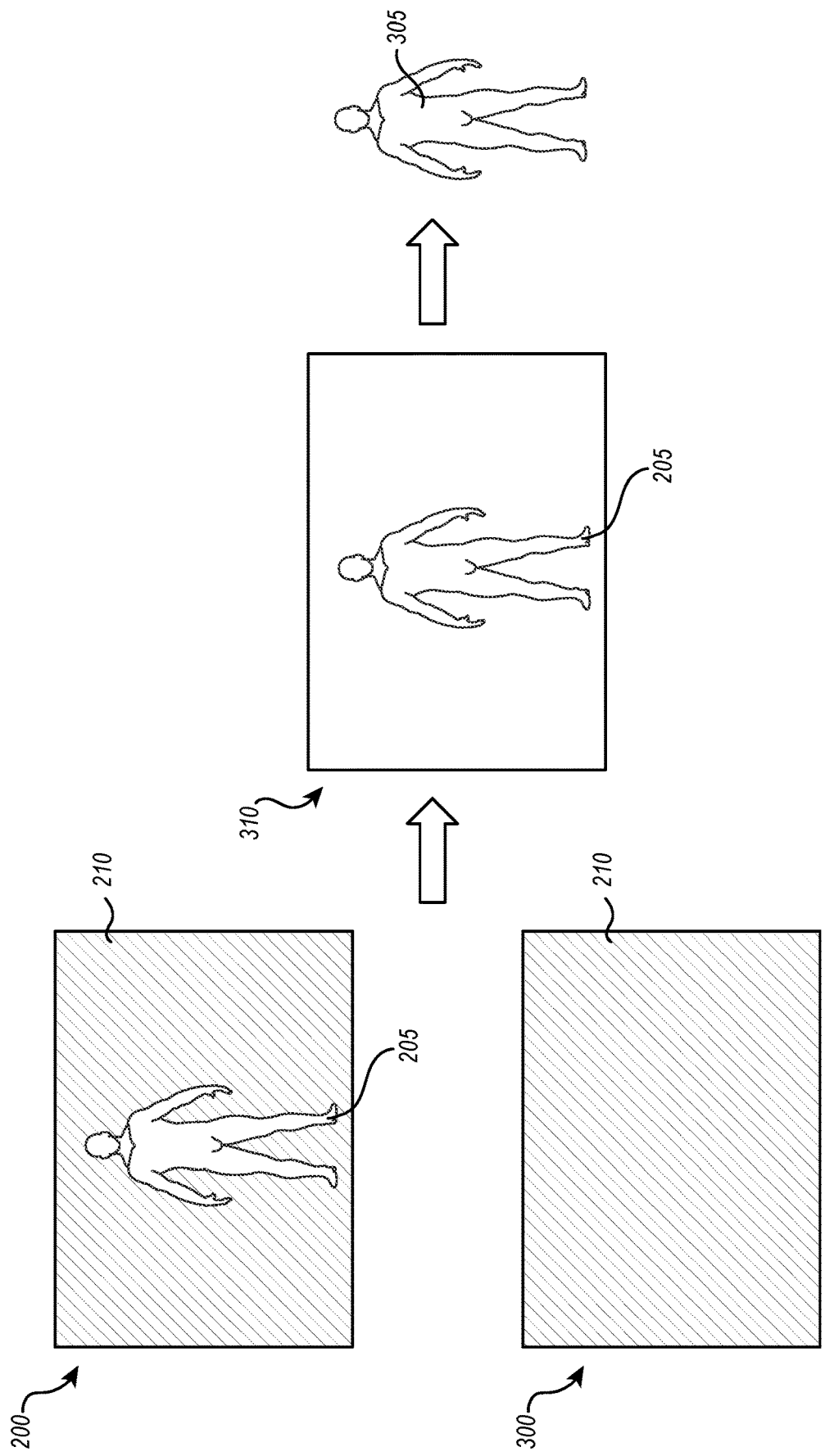
FIG. 3 illustrates exemplary components for generating a mask using image subtraction.

Further, image processing module 115 may be configured to extract real object 205 from the captured image from real environment 200. In at least one implementation, real object 205 is extracted using image subtraction, as illustrated in FIG. 3. Image subtraction can include comparing the captured image from real environment 200 to background data 300. FIG. 3 shows background data 300, which includes an image of real environment 200 without real object 205. In some implementations, background data 300 is captured when real object 205 is not present. In other implementations, real object 205 is already present when background data 300 is captured, such that additional processing may be necessary to distinguish background data 300 from real object 205. In some implementations, real object 205 is extracted using image recognition or other artificial intelligence-based methods for recognizing and extraction real object 205 from the captured image from real environment 200.

When background data 300 is subtracted from the captured image from real environment 200, a real object image 310 results that includes real object 205 without background 210. A mask 305, which comprises extracted real object 205, may then be removed from real object image 310. In some cases, mask 305 may require further image processing to refine mask 305 and remove background noise, particularly when real object 205 is mobile. As used herein, a "mask" may comprise a digital image of the corresponding real object such that when rendered, the mask replicates the real object in appearance. For example, mask 305 as shown comprises a digital, visual copy of real object 205, in this case a human being.

Image processing can include grouping of pixels and excluding dissimilar pixels. In at least one implementation, image processing includes using known hue, saturation, value (HSV) data to include or exclude pixels from mask 305. Real object 205 may also be extracted using green-screen or artificial intelligence technology.

Figure 4:
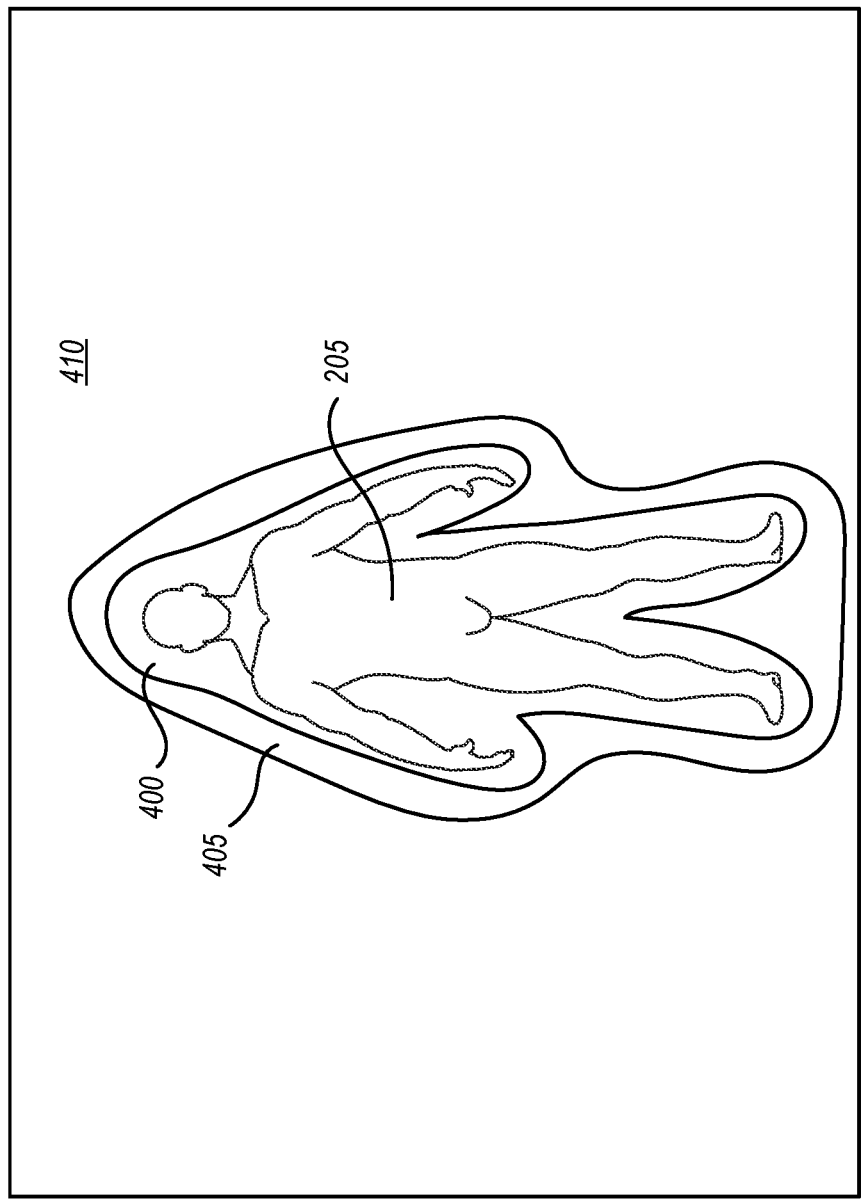
FIG. 4 illustrates an image being processed through an algorithm in accordance with an implementation of the present invention.

In at least one implementation, a confidence skeleton is used as an image processing method. As shown in FIG. 4, using the confidence skeleton includes separating the image produced through image subtraction 310 into probability fields. The probability fields correspond with the user's confidence that the pixels included in the probability field represent a part of real object 205 and are neither part of the background nor noise. A first probability field 400 closely follows the outline of real object 205. Pixels in first probability field 400 are more likely to represent a part of real object 205 and therefore are more likely to be included in mask 305 (not shown). Pixels in a second probability field 405, which represents an area farther from real object 205 than first probability field 400, are less likely to represent a part of real object 205 and therefore are less likely to be included in mask 305. Finally, pixels in a third probability field 410 are likely either background pixels or noise and therefore will likely not be included in mask 305.

Although three probability fields are shown in FIG. 4, one skilled in the art will appreciate that the number and placement of the probability fields are merely exemplary.

The rendering module 120 may be configured to project the captured data from real environment 200 on a first plane within a rendered three-dimensional architectural design space as well as mask 305, or extracted real object 205, on at least one additional plane within the rendered three-dimensional architectural design space. As such, a user viewing the rendered scene would see the image of the real environment 200 and an image of the real object 205, though, in some implementations as will be explained further, the image of the real object 205 may actually comprise a rendering of the mask 305.

As shown in FIG. 1, rendering module 120 may also be in communication with sensor modules 125. Sensor modules 125 may comprise various motion tracking components such as but not limited to accelerometers, gyroscopes, visual motion tracking, GPS, sonar, magnetic tracking systems, barometric systems, and other position tracking systems used to track the position of real object 205 within real environment 200 or, more specifically, within the physical architectural space.

Figure 5:
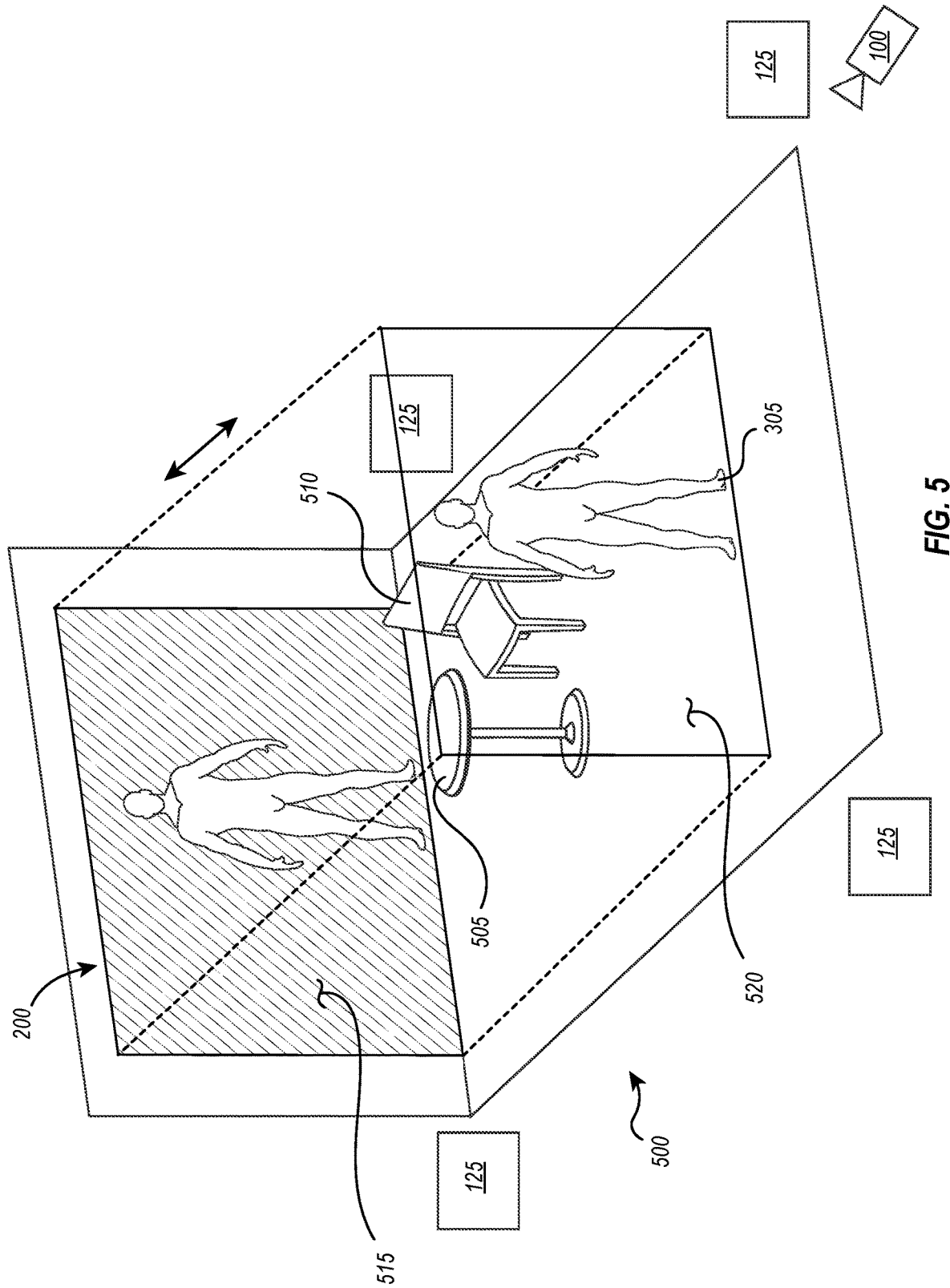
FIG. 5 illustrates a rendered three-dimensional architectural design space.

The projection of images on a first plane 515 and a second plane 520 are shown in FIG. 5, which illustrates a rendered three-dimensional architectural design space 500 that includes virtual architectural components, a rendered table 505 and a rendered chair 510. In some implementations, each virtual architectural component, such as rendered table 505 and rendered chair 510, are rendered from CAD design files of components designed to fit the physical architectural space of real environment 200. Further, in some implementations, at least one virtual architectural component is rendered from a CAD design file that comprises a design matching that of one or more real objects present within real environment 200.

As shown in FIG. 5, the captured data from real environment 200 can be projected on first plane 515 within a rendered three-dimensional architectural design space 500. First plane 515 can represent the background for rendered three-dimensional architectural design space 500. Also, some implementations may include the ability to adjust one or more dimensional parameters of at least one rendered virtual architectural component while three-dimensional architectural design space 500 and real object 205 continue to be projected on first plane 515 and second plane 520 as described herein. As used herein and unless stated otherwise, the use of the "first plane 515" and "second plane 520" does not infer any particular order of the planes within a rendered image.

FIG. 5 also shows mask 305, or extracted real object 205, projected on second plane 520 within rendered three-dimensional architectural design space 500. The location of second plane 520 within rendered three-dimensional architectural design space 500 can be determined by information gathered by camera 100. For example, in at least one implementation a depth camera is used to capture the data from real environment 200. Pixel values within a captured image may be used to determine where, in a measure of physical units, real object 205 is within real environment 200. The location of real object 205 within real environment 200 can then be used to determine where second plane 520 is projected within rendered three-dimensional architectural design space 500. In at least one implementation, the information from camera 100 is gathered, processed, and projected in real time.

Similarly, in at least one implementation, the location of the second plane 520 is determined by information gathered by sensor modules 125 shown in FIG. 1. Various types of sensors 125 may be used to track the location of real object 205 within real environment 200. Then, the location of real object 205 within real environment 200 can then be used to determine where second plane 520 is projected within rendered three-dimensional architectural design space 500. As stated above, in at least one implementation, the location of real object 205 can be tracked and projected within rendered three-dimensional architectural design space 500 in real time.

In FIG. 5, second plane 520 is in front of rendered table 505 and rendered chair 510 within rendered three-dimensional architectural design space 500. Therefore, at least in the illustrated implementation, based on the viewpoint of camera 100, portions of rendered table 505 and rendered chair 510 will be occluded by mask 305, which will correctly be displayed to the user as real object 205 occluding portions of rendered table 505 and rendered chair 510. If, instead, only rendered table 505 were behind second plane 520 and rendered chair 510 were in front of second plane 520, then only portions of rendered table 505 would be occluded by real object 205.

Alternatively, if real object 205, and thus second plane 520 also, were behind rendered table 505 and rendered chair 510, then real object 205 would be at least partially occluded by rendered table 505 and rendered chair 510. In such a case, the mask 305 may not be rendered, but instead the rendered table 505 and rendered chair 510 may be used to occlude the real object 205.

For consistency in data capture, the angle of camera 100 in FIG. 5 is the same as the angle of camera 100 in FIG. 2. In at least one implementation, the projected captured data from real environment 200 on first plane 515 and projected mask 305 on second plane 520 are not angle or viewpoint specific. For example, a voxel-based system may not be viewpoint specific. Additionally, camera 100 and at least one virtual camera may be calibrated such that they are positioned and oriented as data from a real environment is captured.

In at least one implementation, mask 305 is projected on to a virtual three-dimensional model within rendered three-dimensional architectural design space 500. Projecting mask 305 onto a three-dimensional model may solve issues associated with placing a two-dimensional object within a three-dimensional environment.

Figure 6:
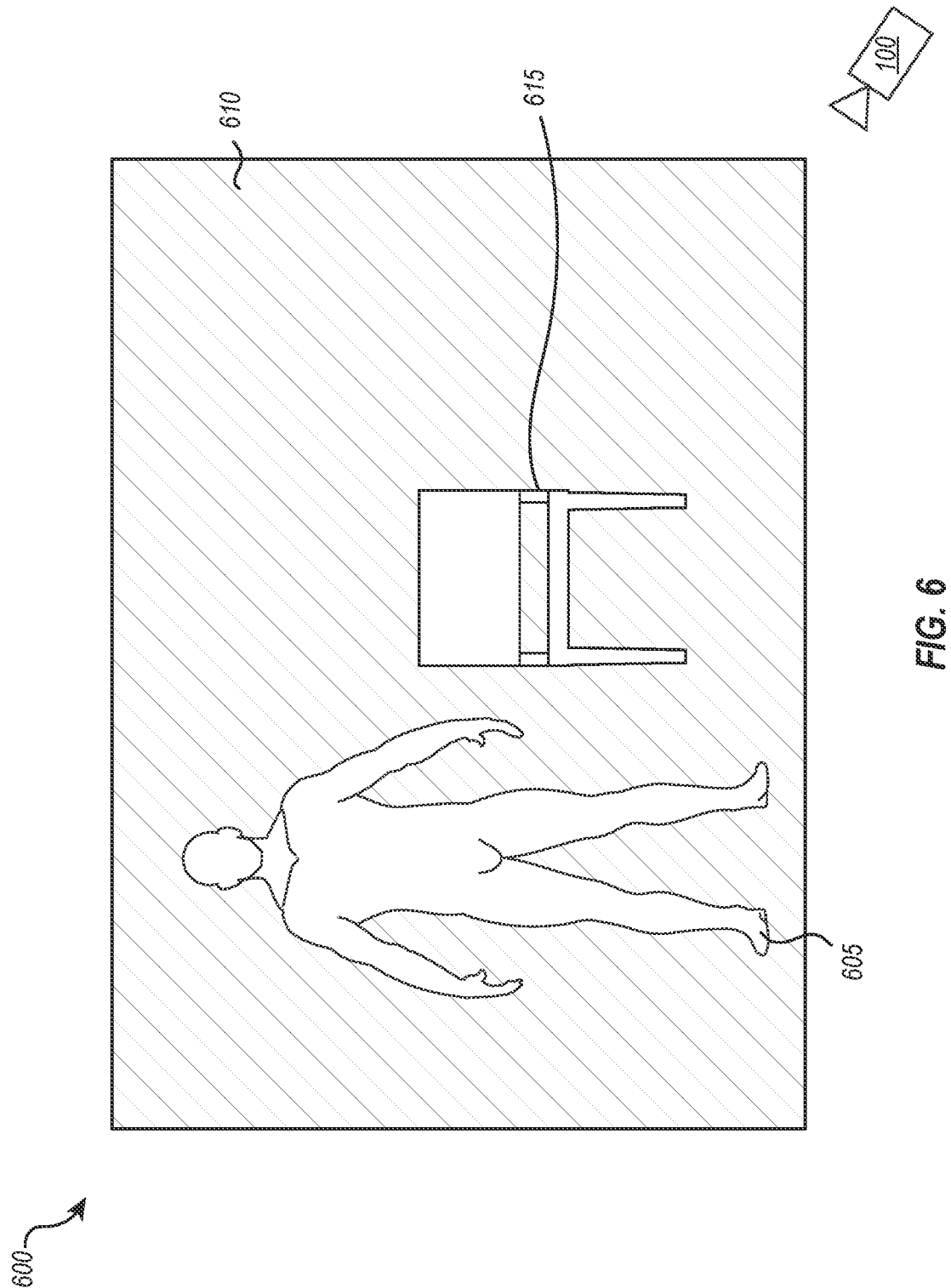
FIG. 6 illustrates an alternative image from a real environment that includes two real objects at varying depths within a physical architectural space.

FIG. 6 illustrates an alternative image captured from a real environment 600. As shown in FIG. 6, the alternative image captured from real environment 600, in similar manner to the implementation illustrated in FIG. 2, can comprise a first real object 605 (in this case a person) and a background 610. The alternative image captured from real environment 600 may also comprise at least one additional real object 615 (in this case a real chair). First real object 605 in FIG. 6 is shown closer to camera 100 than additional real object 615. Camera 100 is also shown in FIG. 6, indicating an angle from which the alternative image captured from real environment 600 is taken to enable perception of depth.

In at least one implementation, alternative image captured from real environment 600 is captured by one or more infrared cameras. The alternative image captured from real environment 600 may also be captured by a depth camera. At least one implementation includes generating a voxel-based representation of first real object 605 (i.e., the person) and additional real object 615 (i.e., the chair) based on image data captured by cameras in a tracked, real, three-dimensional environment.

Figure 7A:
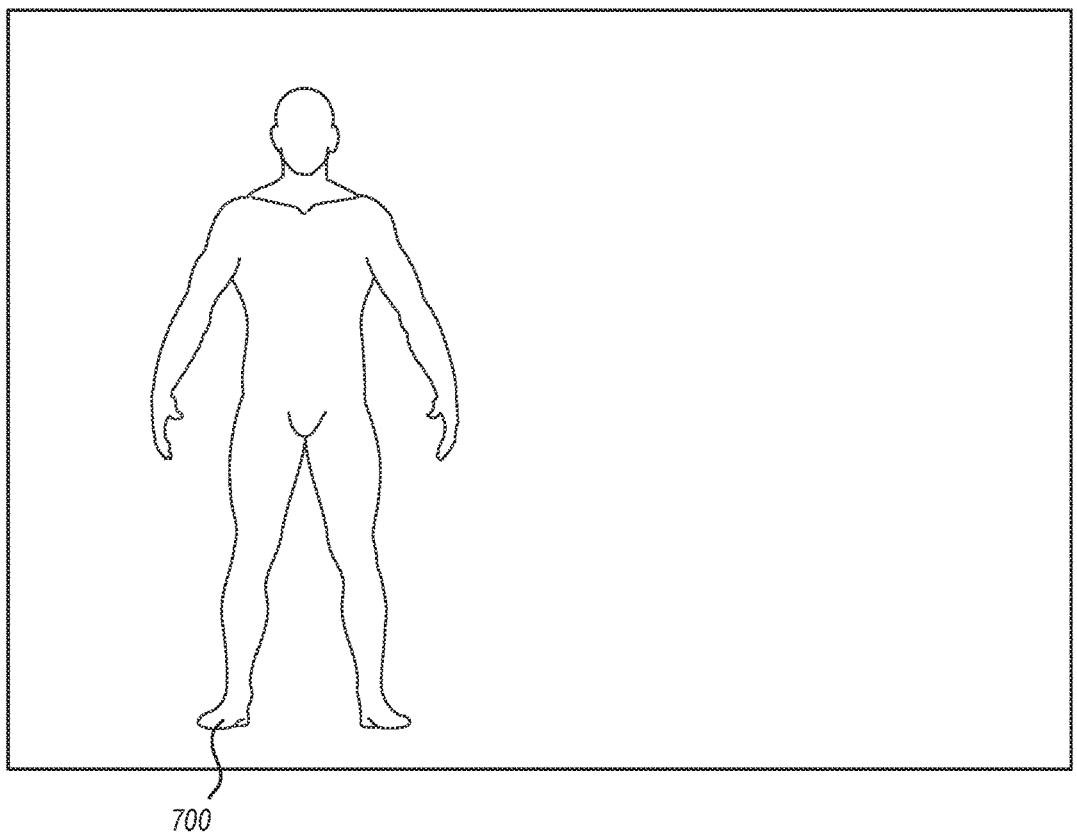
FIGS. 7A-7B illustrate two masks generated from the two real objects of FIG. 6.
Figure 7B:
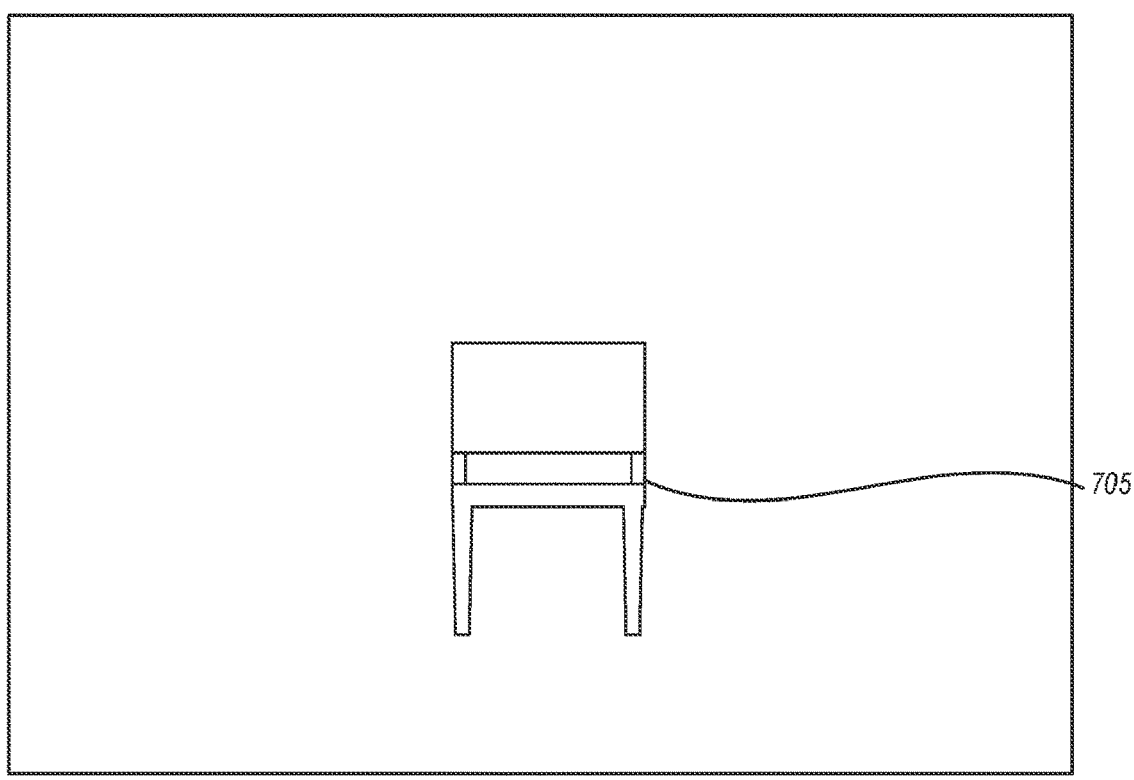

The image processing module 115 of FIG. 1 may be configured to extract first real object 605 and additional real object 615 from the alternative image captured from real environment 600. In at least one implementation, first real object 605 and additional real object 615 are extracted using image subtraction. As shown in FIGS. 7A and 7B, image processing can produce a first mask 700 representative of first real object 605, and at least one additional mask 705 representative of at least one additional real object 615, which comprise extracted first real object 605 and at least one additional real object 615, respectively. Masks 700 and 705 may require further image processing to refine extracted first real object 605 and at least one additional real object 615 and remove background noise.

Figure 8:
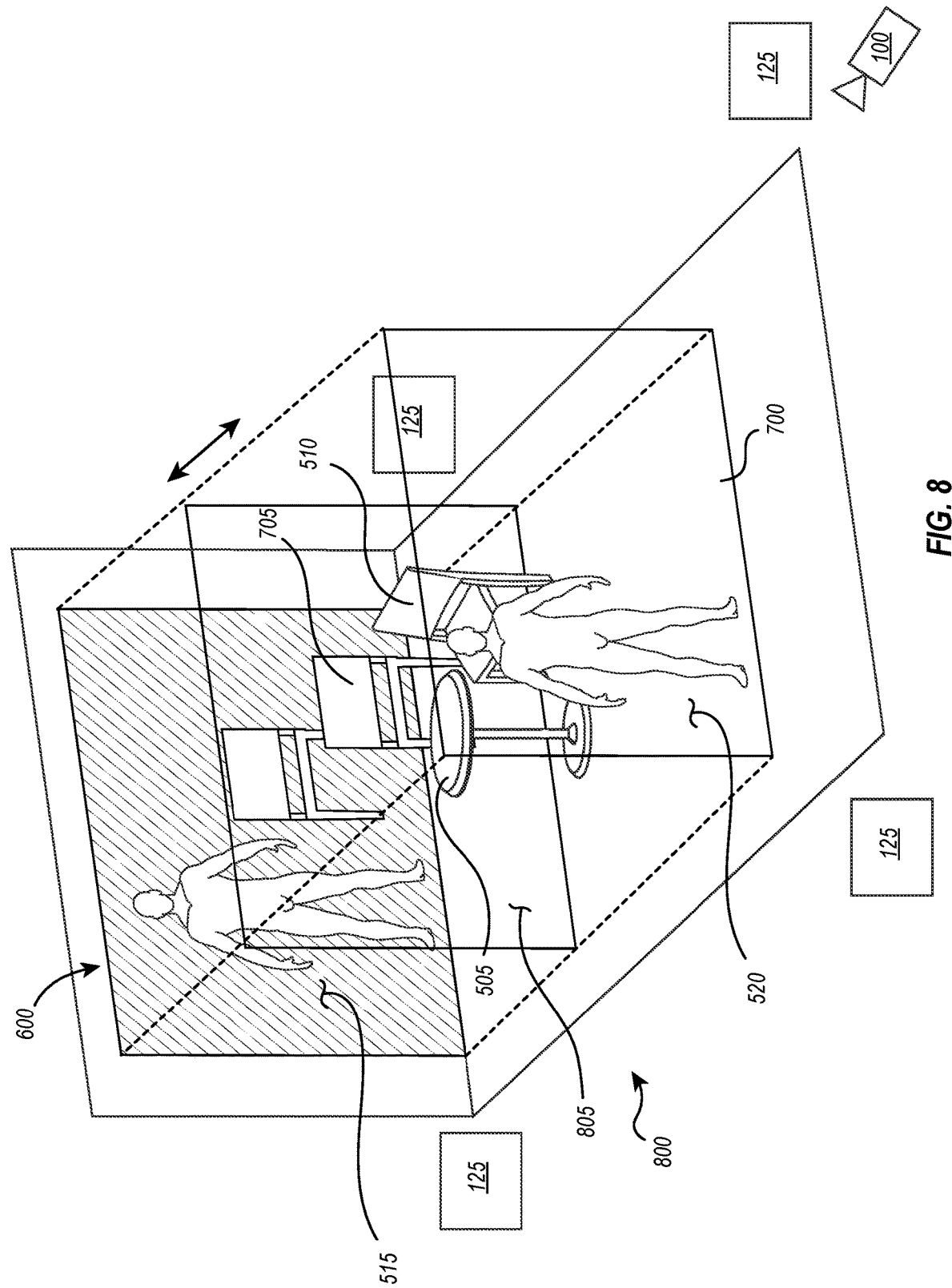
FIG. 8 illustrates an alternative rendered three-dimensional architectural design space having multiple real objects and multiple virtual architectural components.

FIG. 8 shows an alternative rendered three-dimensional architectural design space 800 that includes rendered table 505 and rendered chair 510. As illustrated, the alternative image captured from real environment 600 can be projected on first plane 515 within alternative rendered three-dimensional architectural design space 800. As shown, first plane 515 can thus portray background 600 within alternative rendered three-dimensional architectural design space 800.

FIG. 8 also shows first mask 700 projected on second plane 520 located forward of rendered table 505 and rendered chair 510. Therefore, no part of first mask 700 is occluded by rendered table 505 or rendered chair 510. Instead, the portions of rendered table 505 that are positioned behind first mask 700 are occluded by first mask 700. Additionally, FIG. 8 shows additional mask 705 projected on a third plane 805 behind rendered table 505 and rendered chair 510. Accordingly, rendered table 505 and rendered chair 510 occlude additional mask 705.

In some implementations, the location of second plane 520 and third plane 805 within alternative rendered three-dimensional architectural design space 800 is determined by information gathered by camera 100. For example, in at least one implementation, a depth camera is used to capture the data from real environment 600. Pixel values within the alternative image captured from real environment 600 may be used to determine where, in a measure of physical units, first real object 605 and additional real object 615 are within real environment 600. The location of first real object 605 and additional real object 615 within real environment 600 can then be used to determine where second plane 520 and third plane 805 are to be projected within alternative rendered three-dimensional architectural design space 800. In at least one implementation, the information from camera 100 is gathered, processed, and projected in real time.

FIG. 9 depicts a method 900 for incorporating a real object at varying depths within a rendered three-dimensional architectural design space according to at least one implementation of the present invention. As shown, act 905 comprises receiving captured data from a real environment, the real environment comprising at least one real object within a physical architectural space. In some implementations, the physical architectural space can be enclosed by one or more walls or structures, or alternatively, the physical architectural space can comprise an open area that will be enclosed by virtual architectural components in the rendered virtual three-dimensional architectural design space as disclosed herein. Implementations can also include a physical architectural space that comprises an open area not enclosed by real or virtual objects.

Act 910 comprises extracting the at least one real object from the captured data from the real environment. As discussed herein, implementations of the present invention include extraction of the at least one real object by various means, such as but not limited to image subtraction, generation of probability fields surrounding the real object, and artificial intelligence-driven image recognition.

Act 915 comprises providing a rendered three-dimensional architectural design space comprising one or more virtual architectural components, wherein each virtual architectural component is designed to coordinate with the physical architectural space. In some implementations, virtual architectural components can be designed in Computer Aided Design (CAD) software to coordinate with the physical architectural space and the resulting CAD data file can be used to accurately render the virtual architectural component within the three-dimensional architectural design space. In at least one implementation, the rendered architectural design space is a representation of the physical architectural space and a design generated by CAD software may be used to indicate where each virtual architectural component is placed.

Additionally, some implementations can include a step wherein a CAD program or module also receives data captured from the real environment and uses the captured data to generate a virtual environment within the CAD program or module. The CAD program or module can be an integral or separate part of the occlusion-solution software. The CAD-specific can thus enable a designer to place one or more virtual architectural components within the virtual rendering of the real environment and adjust each virtual architectural component until a desired design is achieved. Such CAD-enabled design can take place at any time within the method disclosed herein, such as before or after the occlusion-prevention software received the captured data from the real environment or immediately prior to rendering the three-dimensional architectural design space. Accordingly, each virtual architectural component within the rendered three-dimensional architectural design space can be altered, repositioned, removed, or replaced at any point in the disclosed method or procedure.

Act 920 comprises projecting the captured data from the real environment on a first plane within the rendered three-dimensional architectural design space. In some embodiments, the position of the first plane is behind the one or more virtual architectural components such that each virtual architectural component would occlude the projection of the real environment on the first plane.

Act 925 comprises projecting the extracted at least one real object on at least one additional plane within the rendered three-dimensional architectural design space, such that a position of the at least one additional plane causes the at least one real object to either occlude or be occluded by at least one of the one or more virtual architectural components. In at least one implementation, the position of the at least one additional plane depends on a position of the at least one real object within the real environment. Alternatively, the position of the at least one additional plane can be adjusted to an alternative position such that the real object may be projected in any desired position within the real environment. Some implementations comprise multiple real objects projected on multiple additional planes, such that one real object is in a different position then another real object, and such that each projected real object is properly occluded by the other real objects and virtual architectural components throughout the rendered three-dimensional architectural design space.

FIG. 10 depicts a method 1000 for incorporating a real object at varying depths within a rendered three-dimensional architectural design space according to at least one implementation of the present invention. As shown, act 1005 comprises capturing, with one or more sensors, data from a real environment comprising at least one real object within a physical architectural space. In some implementations, the one or more sensors comprise one or more depth cameras, infrared sensors, multiple digital cameras positioned and calibrated to capture a three-dimensional environment, and so forth.

Act 1010 comprises extracting the at least one real object from the captured data from the real environment by separating data related to the at least one real object from data related to the physical architectural space. In some implementations, real objects comprise any combination of human beings or other moving objects. In at least one implementation, at least one real object comprises real architectural components and other stationary objects.

Act 1015 comprises providing a rendered three-dimensional architectural design space comprising one or more virtual architectural components, wherein each virtual architectural component is designed to coordinate with the physical architectural space. In at least one implementation, at least one of the virtual architectural components matched the design and dimensions of one of the at least one real objects.

Act 1020 comprises projecting the captured data from the real environment on a first plane within the rendered three-dimensional architectural design space. Act 1025 comprises projecting the extracted at least one real object on at least one additional plane within the rendered three-dimensional architectural design space, such that a position of the at least one additional plane causes the at least one real object to either occlude or be occluded by at least one of the one or more virtual architectural components.

One skilled in the art will appreciate that the number of objects and architectural components, real and virtual, and their placement in the figures are exemplary and the present invention is not limited by what is illustrated. Similarly, the number of planes and their placement are exemplary in the figures and in no way limit the present invention.

Further, the methods may be practiced by a computer system including one or more processors and computer-readable media such as computer memory. In particular, the computer memory may store computer-executable instructions that when executed by one or more processors cause various functions to be performed, such as the acts recited in the embodiments.

Computing system functionality can be enhanced by a computing systems' ability to be interconnected to other computing systems via network connections. Network connections may include, but are not limited to, connections via wired or wireless Ethernet, cellular connections, or even computer to computer connections through serial, parallel, USB, or other connections. The connections allow a computing system to access services at other computing systems and to quickly and efficiently receive application data from other computing systems.

Interconnection of computing systems has facilitated distributed computing systems, such as so-called "cloud" computing systems. In this description, "cloud computing" may be systems or resources for enabling ubiquitous, convenient, on-demand network access to a shared pool of configurable computing resources (e.g., networks, servers, storage, applications, services, etc.) that can be provisioned and released with reduced management effort or service provider interaction. A cloud model can be composed of various characteristics (e.g., on-demand self-service, broad network access, resource pooling, rapid elasticity, measured service, etc), service models (e.g., Software as a Service ("SaaS"), Platform as a Service ("PaaS"), Infrastructure as a Service ("IaaS"), and deployment models (e.g., private cloud, community cloud, public cloud, hybrid cloud, etc.).

Cloud and remote based service applications are prevalent. Such applications are hosted on public and private remote systems such as clouds and usually offer a set of web based services for communicating back and forth with clients.

Many computers are intended to be used by direct user interaction with the computer. As such, computers have input hardware and software user interfaces to facilitate user interaction. For example, a modern general purpose computer may include a keyboard, mouse, touchpad, camera, etc. for allowing a user to input data into the computer. In addition, various software user interfaces may be available.

Examples of software user interfaces include graphical user interfaces, text command line based user interface, function key or hot key user interfaces, and the like.

Disclosed embodiments may comprise or utilize a special purpose or general-purpose computer including computer hardware, as discussed in greater detail below. Disclosed embodiments also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: physical computer-readable storage media and transmission computer-readable media.

Physical computer-readable storage media includes RAM, ROM, EEPROM, CD-ROM or other optical disk storage (such as CDs, DVDs, etc), magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry program code in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Following are some further example embodiments of the invention. These are presented only by way of example and are not intended to limit the scope of the invention in any way.

Exemplary Embodiments of Computer Systems

Embodiment 1. A computer system for incorporating a real object at varying depths within a rendered three-dimensional architectural design space, comprising: one or more processors; and one or more computer-readable media having stored thereon executable instructions that when executed by the one or more processors configure the computer system to perform at least the following: receive captured data from a real environment, wherein the real environment comprises at least one real object within a physical architectural space; extract the at least one real object from the captured data from the real environment; provide a rendered three-dimensional architectural design space comprising one or more virtual architectural components, wherein each virtual architectural component is designed to coordinate with the physical architectural space; project the captured data from the real environment on a first plane within the rendered three-dimensional architectural design space; and project the extracted at least one real object on at least one additional plane within the rendered three-dimensional architectural design space, such that a position of the at least one additional plane causes the at least one real object to either occlude or be occluded by at least one of the one or more virtual architectural components.

Embodiment 2. The computer system as recited in embodiment 1, wherein extracting the at least one real object from the captured data from the real environment comprises subtraction of an image from a background image comprising the physical architectural space to generate a mask representative of the real object.

Embodiment 3. The computer system as recited in any of embodiments 1-2, wherein extracting the at least one real object from the captured data from the real environment further comprises separating the mask into a plurality of probability fields.

Embodiment 4. The computer system as recited in any of embodiments 1-3, wherein the positions of the at least one additional plane within the rendered three-dimensional architectural design space is dependent on a relative position of the at least one real object within the real environment.

Embodiment 5. The computer system as recited in any of embodiments 1-4, wherein the relative position of the at least one real object within the real environment is captured by a depth camera.

Embodiment 6. The computer system as recited in any of embodiments 1-5, wherein the relative position of the at least one real object within the real environment is captured by one or more motion tracking sensors.

Embodiment 7. The computer system as recited in any of embodiments 1-6, wherein the position of the at least one additional plane within the rendered three-dimensional architectural design space is determined by the position of the at least one real object within the real environment in real time.

Embodiment 8. The computer system as recited in any of embodiments 1-7, wherein the executable instructions are executable to configure the computer system to calibrate at least one real camera and at least one virtual camera such that they are positioned and oriented as data from the real environment is captured.

Embodiment 9. The computer system as recited in any of embodiments 1-8, wherein the executable instructions are executable to configure the computer system to: receive input to adjust at least one dimensional parameter of at least one of the one or more virtual architectural components; and update the adjusted at least one of the one or more virtual architectural components within the rendered three-dimensional architectural design space while continuing to project the captured data from the real environment on the first plane and the at least one real object on the at least one additional plane.

Embodiment 10. The computer system as recited in any of embodiments 1-9, wherein the rendered three-dimensional architectural design space corresponds in dimensions to the physical architectural space, and wherein each of the one or more virtual architectural components comprises a CAD design file that is mapped to a particular location within the physical architectural space when rendered within the rendered three-dimensional architectural design space.

Embodiment 11. The computer system as recited in any of embodiments 1-10, wherein at least one of the one or more virtual architectural components comprises a CAD design file corresponding to the at least one real object, such that the at least one of the one or more virtual architectural objects matches the at least one real object.

Embodiment 12. The computer system as recited in any of embodiments 1-11, wherein the rendered three-dimensional architectural design space is generated from the captured data from the real environment and one or more CAD design files corresponding to the one or more virtual architectural objects.

Exemplary Embodiments of Computer-Implemented Methods

Embodiment 13. A computer-implemented method for incorporating a real object at varying depths within a rendered three-dimensional architectural design space, the method executed on one or more computer processors, the method comprising: receiving captured data from a real environment, wherein the real environment comprises at least one real object within a physical architectural space; extracting the at least one real object from the captured data from the real environment; providing a rendered three-dimensional architectural design space comprising one or more virtual architectural components, wherein each virtual architectural component is designed to coordinate with the physical architectural space; projecting the captured data from the real environment on a first plane within the rendered three-dimensional architectural design space; and projecting the extracted at least one real object on at least one additional plane within the rendered three-dimensional architectural design space, such that a position of the at least one additional plane causes the at least one real object to either occlude or be occluded by at least one of the one or more virtual architectural components.

Embodiment 14. The computer-implemented method as recited in embodiment 13, wherein extracting the at least one real object from the captured data from the real environment comprises subtraction of an image from a background image comprising the physical architectural space to generate a mask representative of the real object.

Embodiment 15. The computer-implemented method as recited in any of embodiments 13-14, wherein extracting the at least one real object from the captured data from the real environment further comprises separating the mask into a plurality of probability fields.

Embodiment 16. The computer-implemented method as recited in any of embodiments 13-15, wherein the positions of the at least one additional plane within the rendered three-dimensional architectural design space is dependent on a relative position of the at least one real object within the real environment.

Embodiment 17. The computer-implemented method as recited in any of embodiments 13-16, wherein the relative position of the at least one real object within the real environment is captured by a depth camera.

Embodiment 18. The computer-implemented method as recited in any of embodiments 13-17, wherein the relative position of the at least one real object within the real environment is captured by one or more motion tracking sensors.

Embodiment 19. The computer-implemented method as recited in any of embodiments 13-18, wherein the position of the at least one additional plane within the rendered three-dimensional architectural design space is determined by the position of the at least one real object within the real environment in real time.

Embodiment 20. The computer-implemented method as recited in any of embodiments 13-19, further comprising: calibrating at least one real camera and at least one virtual camera such that they are positioned and oriented as data from the real environment is captured.

Embodiment 21. The computer-implemented method as recited in any of embodiments 13-20, further comprising: receiving input to adjust at least one dimensional parameter of at least one of the one or more virtual architectural components; and updating the adjusted at least one of the one or more virtual architectural components within the rendered three-dimensional architectural design space while continuing to project the captured data from the real environment on the first plane and the at least one real object on the at least one additional plane.

Embodiment 22. The computer-implemented method as recited in any of embodiments 13-21, wherein the rendered three-dimensional architectural design space corresponds in dimensions to the physical architectural space, and wherein each of the one or more virtual architectural components comprises a CAD design file that is mapped to a particular location within the physical architectural space when rendered within the rendered three-dimensional architectural design space.

Embodiment 23. The computer-implemented method as recited in any of embodiments 13-22, wherein at least one of the one or more virtual architectural components comprises a CAD design file corresponding to the at least one real object, such that the at least one of the one or more virtual architectural objects matches the at least one real object.

Embodiment 24. The computer-implemented method as recited in any of embodiments 13-23, wherein the rendered three-dimensional architectural design space is generated from the captured data from the real environment and one or more CAD design files corresponding to the one or more virtual architectural objects.

Exemplary Embodiments of Computer-Readable Media

Embodiment 25. A computer-readable media comprising one or more physical computer-readable storage media having stored thereon computer-executable instructions that, when executed at a processor, cause a computer system to perform a method for incorporating a real object at varying depths within a rendered three-dimensional architectural design space, the method comprising: capturing, with one or more sensors, data from a real environment, wherein the real environment comprises at least one real object within a physical architectural space; extract the at least one real object from the captured data from the real environment, wherein extraction of the at least one real object comprises separating data related to the at least one real object from data related to the physical architectural space; provide a rendered three-dimensional architectural design space comprising one or more virtual architectural components, wherein each virtual architectural component is designed to coordinate with the physical architectural space; project the captured data from the real environment on a first plane within the rendered three-dimensional architectural design space; and project the extracted at least one real object on at least one additional plane within the rendered three-dimensional architectural design space, such that a position of the at least one additional plane causes the at least one real object to either occlude or be occluded by at least one of the one or more virtual architectural components.

Embodiment 26. The computer-readable media as recited in embodiment 25, wherein extracting the at least one real object from the captured data from the real environment comprises subtraction of an image from a background image comprising the physical architectural space to generate a mask representative of the real object.

Embodiment 27. The computer-readable media as recited in any of embodiments 25-26, wherein extracting the at least one real object from the captured data from the real environment further comprises separating the mask into a plurality of probability fields.

Embodiment 28. The computer-readable media as recited in any of embodiments 25-27, wherein the positions of the at least one additional plane within the rendered three-dimensional architectural design space is dependent on a relative position of the at least one real object within the real environment.

Embodiment 29. The computer-readable media as recited in any of embodiments 25-28, wherein the relative position of the at least one real object within the real environment is captured by a depth camera.

Embodiment 30. The computer-readable media as recited in any of embodiments 25-29, wherein the relative position of the at least one real object within the real environment is captured by one or more motion tracking sensors.

Embodiment 31. The computer-readable media as recited in any of embodiments 25-30, wherein the position of the at least one additional plane within the rendered three-dimensional architectural design space is determined by the position of the at least one real object within the real environment in real time.

Embodiment 32. The computer-readable media as recited in any of embodiments 25-31, wherein the executable instructions are executable to configure the computer system to calibrate at least one real camera and at least one virtual camera such that they are positioned and oriented as data from the real environment is captured.

Embodiment 33. The computer-readable media as recited in any of embodiments 25-32, wherein the executable instructions are executable to configure the computer system to: receive input to adjust at least one dimensional parameter of at least one of the one or more virtual architectural components; and update the adjusted at least one of the one or more virtual architectural components within the rendered three-dimensional architectural design space while continuing to project the captured data from the real environment on the first plane and the at least one real object on the at least one additional plane.

Embodiment 34. The computer-readable media as recited in any of embodiments 25-33, wherein the rendered three-dimensional architectural design space corresponds in dimensions to the physical architectural space, and wherein each of the one or more virtual architectural components comprises a CAD design file that is mapped to a particular location within the physical architectural space when rendered within the rendered three-dimensional architectural design space.

Embodiment 35. The computer-readable media as recited in any of embodiments 25-34, wherein at least one of the one or more virtual architectural components comprises a CAD design file corresponding to the at least one real object, such that the at least one of the one or more virtual architectural objects matches the at least one real object.

Embodiment 36. The computer-readable media as recited in any of embodiments 25-35, wherein the rendered three-dimensional architectural design space is generated from the captured data from the real environment and one or more CAD design files corresponding to the one or more virtual architectural objects.

We claim:

1. A computer system for incorporating a real object at varying depths within a rendered three-dimensional architectural design space, comprising:

one or more processors; and one or more computer-readable media having stored thereon executable instructions that when executed by the one or more processors configure the computer system to perform at least the following:

receive captured data from a real environment, wherein the real environment comprises at least one real object within a physical architectural space;

extract the at least one real object from the captured data from the real environment;

provide a rendered three-dimensional architectural design space comprising one or more virtual architectural components, wherein each virtual architectural component is designed to coordinate with the physical architectural space;

project the captured data from the real environment on a first plane within the rendered three-dimensional architectural design space; and project the extracted at least one real object on at least one additional plane within the rendered three-dimensional architectural design space, the at least one additional plane being positioned such that the projected at least one real object is properly occluded within the rendered three-dimensional architectural design space.

2. The computer system of claim 1, wherein extracting the at least one real object from the captured data from the real environment comprises subtraction of an image from a background image comprising the physical architectural space to generate a mask representative of the real object.

3. The computer system of claim 2, wherein extracting the at least one real object from the captured data from the real environment further comprises separating the mask into a plurality of probability fields.

4. The computer system of claim 1, wherein a position of the at least one additional plane within the rendered three-dimensional architectural design space is dependent on a relative position of the at least one real object within the real environment.

5. The computer system of claim 4, wherein the relative position of the at least one real object within the real environment is captured by a depth camera.

6. The computer system of claim 4, wherein the relative position of the at least one real object within the real environment is captured by one or more motion tracking sensors.

7. The computer system of claim 4, wherein the position of the at least one additional plane within the rendered three-dimensional architectural design space is determined by the relative position of the at least one real object within the real environment in real time.

8. The computer system of claim 1, wherein the executable instructions are executable to configure the computer system to calibrate at least one real camera and at least one virtual camera such that they are positioned and oriented as data from the real environment is captured.

9. The computer system of claim 1, wherein the executable instructions are executable to configure the computer system to:

receive input to adjust at least one dimensional parameter of at least one of the one or more virtual architectural components; and update the adjusted at least one of the one or more virtual architectural components within the rendered three-dimensional architectural design space while continuing to project the captured data from the real environment on the first plane and the at least one real object on the at least one additional plane.

10. The computer system of claim 1, wherein the rendered three-dimensional architectural design space corresponds in dimensions to the physical architectural space, and wherein each of the one or more virtual architectural components comprises a CAD design file that is mapped to a particular location within the physical architectural space when rendered within the rendered three-dimensional architectural design space.

11. The computer system of claim 1, wherein at least one of the one or more virtual architectural components comprises a CAD design file corresponding to the at least one real object, such that the at least one of the one or more virtual architectural objects matches the at least one real object.

12. The computer system of claim 1, wherein the rendered three-dimensional architectural design space is generated from the captured data from the real environment and one or more CAD design files corresponding to the one or more virtual architectural objects.

13. A computer-implemented method for incorporating a real object at varying depths within a rendered three-dimensional architectural design space, the method executed on one or more computer processors, the method comprising:

receiving captured data from a real environment, wherein the real environment comprises at least one real object within a physical architectural space;

extracting the at least one real object from the captured data from the real environment;

providing a rendered three-dimensional architectural design space comprising one or more virtual architectural components, wherein each virtual architectural component is designed to coordinate with the physical architectural space;

projecting the captured data from the real environment on a first plane within the rendered three-dimensional architectural design space; and projecting the extracted at least one real object on at least one additional plane within the rendered three-dimensional architectural design space, the at least one additional plane being positioned such that the projected at least one real object is properly occluded within the rendered three-dimensional architectural design space.

14. The computer-implemented method of claim 13, further comprising:

receiving input to adjust at least one dimensional parameter of at least one of the one or more virtual architectural components; and updating the adjusted at least one of the one or more virtual architectural components within the rendered three-dimensional architectural design space while continuing to project the captured data from the real environment on the first plane and the at least one real object on the at least one additional plane.

15. The computer-implemented method of claim 13, wherein the rendered three- dimensional architectural design space corresponds in dimensions to the physical architectural space, and wherein each of the one or more virtual architectural components comprises a CAD design file that is mapped to a particular location within the physical architectural space when rendered within the rendered three-dimensional architectural design space.

16. The computer-implemented method of claim 13, wherein at least one of the one or more virtual architectural components comprises a CAD design file corresponding to the at least one real object, such that the at least one of the one or more virtual architectural objects matches the at least one real object.

17. A non-transitory computer-readable storage medium comprising one or more physical computer-readable storage media having stored thereon computer-executable instructions that, when executed at a processor, cause a computer system to perform a method for incorporating a real object at varying depths within a rendered three-dimensional architectural design space, the method comprising:
- capturing, with one or more sensors, data from a real environment, wherein the real environment comprises at least one real object within a physical architectural space;
- extracting the at least one real object from the captured data from the real environment, wherein extraction of the at least one real object comprises separating data related to the at least one real object from data related to the physical architectural space;
- providing a rendered three-dimensional architectural design space comprising one or more virtual architectural components, wherein each virtual architectural component is designed to coordinate with the physical architectural space;
- projecting the captured data from the real environment on a first plane within the rendered three-dimensional architectural design space; and
- projecting the extracted at least one real object on at least one additional plane within the rendered three-dimensional architectural design space, the at least one additional plane being positioned such that the projected at least one real object is properly occluded within the rendered three-dimensional architectural design space.

18. The non-transitory computer-readable storage medium of claim 17, wherein the executable instructions are executable to configure the computer system to perform the method for incorporating a real object at varying depths within a rendered three-dimensional architectural design space, the method comprising:
- receiving input to adjust at least one dimensional parameter of at least one of the one or more virtual architectural components; and
- updating the adjusted at least one of the one or more virtual architectural components within the rendered three-dimensional architectural design space while continuing to project the captured data from the real environment on the first plane and the at least one real object on the at least one additional plane.

19. The non-transitory computer-readable storage medium of claim 17, wherein the rendered three-dimensional architectural design space corresponds in dimensions to the physical architectural space, and wherein each of the one or more virtual architectural components comprises a CAD design file that is mapped to a particular location within the physical architectural space when rendered within the rendered three-dimensional architectural design space.

20. The non-transitory computer-readable storage medium of claim 17, wherein at least one of the one or more virtual architectural components comprises a CAD design file corresponding to the at least one real object, such that the at least one of the one or more virtual architectural objects matches the at least one real object.

\* \* \* \* \*